(12) United States Patent
Yang et al.

(10) Patent No.: US 8,669,616 B2
(45) Date of Patent: Mar. 11, 2014

(54) METHOD FOR FORMING N-SHAPED BOTTOM STRESS LINER

(71) Applicant: Globalfoundries Singapore Pte. Ltd., Singapore (SG)

(72) Inventors: Xiaodong Yang, Hopewell Junction, NY (US); Yanxiang Liu, Glenville, NY (US); Vara Govindeswara Reddy Vakada, Clifton Park, NY (US); Jinping Liu, Ballston Lake, NY (US); Min Dai, Allendale, NJ (US)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/026,640

(22) Filed: Sep. 13, 2013

(65) Prior Publication Data

US 2014/0015020 A1    Jan. 16, 2014

Related U.S. Application Data

(62) Division of application No. 13/348,771, filed on Jan. 12, 2012, now Pat. No. 8,557,668.

(51) Int. Cl.
    *H01L 27/12* (2006.01)

(52) U.S. Cl.
    USPC .................................. 257/347; 257/E21.561

(58) Field of Classification Search
    USPC ................... 257/347, E21.561; 438/296, 300
    See application file for complete search history.

(56) References Cited

U.S. PATENT DOCUMENTS 8,557,668 B2 * 10/2013 Yang et al. ..................... 438/296
2010/0283103 A1 * 11/2010 Takei et al. ..................... 257/347

\* cited by examiner

*Primary Examiner* — Mark Prenty
(74) *Attorney, Agent, or Firm* — Ditthavong Mori & Steiner, P.C.

(57) ABSTRACT

Semiconductor devices with n-shaped bottom stress liners are formed. Embodiments include forming a protuberance on a substrate, conformally forming a sacrificial material layer over the protuberance, forming a gate stack above the sacrificial material layer on a silicon layer, removing the sacrificial material layer to form a tunnel, and forming a stress liner in the tunnel conforming to the shape of the protuberance. Embodiments further include forming a silicon layer over the sacrificial material layer and lining the tunnel with a passivation layer prior to forming the stress liner.

20 Claims, 9 Drawing Sheets

METHOD FOR FORMING N-SHAPED BOTTOM STRESS LINER

TECHNICAL FIELD

The present disclosure relates to a method of fabricating semiconductor devices with bottom stress liners. The present disclosure is particularly applicable to 22 nanometer (nm) technology nodes and beyond.

BACKGROUND

The integration of hundreds of millions of circuit elements, such as transistors, on a single integrated circuit necessitates further scaling down or micro-miniaturization of the physical dimensions of circuit elements, including interconnection structures. Micro-miniaturization has engendered a dramatic increase in transistor engineering complexity, resulting in several problems.

One such problem is the difficulty in applying stress effectively for high-density devices. Effectively applying stress is limited by several factors, such as smaller gate-to-gate spacing, less source/drain volume, and raised source/drain structures. Traditional contact etch stop layer (CESL) stressor and stress memorization techniques need a stress liner surrounding the gate stack and the spacer. However, these techniques are less effective because the smaller gate-to-gate space impedes insertion of the stress liner. Further, for raised source/drain regions, the stress liner is farther away from the channel and less stress can be transferred to the channel. Additionally, gate stack aspect ratios are usually higher at the advanced technology node, which prevents stress from transferring to the channel.

Another known stress technique, embedding in the source/drain regions either silicon germanium (eSiGe) for pMOSFETS or silicon carbide (eSiC) for nMOSFETS, is ineffective as the source/drain volume is reduced with scaling to smaller and smaller pitches. Such techniques are particularly ineffective for semiconductor devices with extremely thin silicon-on-insulator (ETSOI) substrates (employed for the fundamentally superior short channel control characteristics).

A need therefore exists for methodology enabling fabrication of semiconductor devices with improved channel stress, and the resulting devices.

SUMMARY

An aspect of the present disclosure is an efficient method of fabricating a semiconductor device with an n-shaped bottom stress liner.

Another aspect of the present disclosure is a semiconductor device including an n-shaped stress liner.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method including: forming a protuberance on a substrate; conformally forming a sacrificial material layer over the protuberance; forming a gate stack above the sacrificial material layer; removing the sacrificial material layer forming a tunnel; and forming a stress liner in the tunnel conforming to the shape of the protuberance.

Aspects of the present disclosure include forming a silicon layer above the sacrificial material layer prior to forming the gate stack, a surface of the silicon layer nearest the sacrificial material layer conforming to the shape of the protuberance. Another aspect includes forming the gate stack according to a gate first process flow and forming source/drain regions embedded within the silicon layer after forming the gate stack, or forming the gate stack according to a gate last process flow and forming source/drain regions embedded within the silicon layer prior to forming the gate stack. An additional aspect includes forming raised source/drain regions on the silicon layer subsequent to forming the stress liner. A further aspect includes conformally lining the tunnel with a passivation layer prior to forming the stress liner. Another aspect includes etching the substrate to form the protuberance. Yet another aspect includes conformally forming an additional stress liner over the gate stack and the substrate. Additional aspects include forming the sacrificial material layer between a pair of shallow trench isolation (STI) structures, removing a portion of each STI structure, exposing edges of the sacrificial material layer, and removing the sacrificial material layer according to a self-aligned process. Another aspect includes forming the sacrificial material layer by epitaxially growing silicon germanium (SiGe) over the protuberance. A further aspect includes aligning the gate stack with the protuberance.

Another aspect of the present disclosure includes a method including: etching a silicon substrate to form a protuberance on the silicon substrate; epitaxially growing a SiGe layer over the protuberance; forming a silicon layer above the SiGe layer, a surface of the silicon layer contiguous with the SiGe layer conforming to the shape of the protuberance; forming source/drain regions above or embedded within the silicon layer; forming a gate stack above the protuberance; removing the SiGe layer, forming a tunnel; and forming a stress liner in the tunnel conforming to the shape of the protuberance. Another aspect includes conformally lining the tunnel with a passivation layer prior to forming the stress liner, and conformally forming an additional stress liner over the gate stack and the substrate.

Another aspect of the present disclosure is a device including: a substrate having a protuberance; a stress liner above and conforming to the shape of the protuberance; and a gate stack above the stress liner.

Aspects include a device including a silicon layer above the stress liner, a surface of the silicon layer nearest the stress liner conforming to the shape of the protuberance. Another aspect includes source/drain regions in or above the silicon layer. Further aspects include a first passivation layer between the stress liner and the substrate conforming to the shape of the protuberance, and a second passivation layer between the stress liner and the silicon layer conforming to the shape of the protuberance. An additional aspect includes a pair of STI structures, with the protuberance being between the pair of STI structures. A further aspect includes the stress liner having a thickness of approximately 20 nm. Another aspect includes an additional stress liner above the gate stack. In another aspect, the base of the protuberance is wider than the top.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of ineffective application of stress in high-density semiconductor devices. Small spaces between gates renders insertion of stress liners difficult, reduced source/drain region volume provides insufficient space for embedded stress material, and raised source/drain regions result in stress liners located too far from the channel. In accordance with embodiments of the present disclosure, an n-shaped bottom stress liner is formed between the substrate and gate stack to apply sufficient stress to the channel.

Methodology in accordance with embodiments of the present disclosure includes forming a protuberance on a substrate, such as by etching the substrate. Next, a sacrificial material layer is conformally formed over the substrate and protuberance, for example by epitaxially growing SiGe over the protuberance. A silicon layer is deposited over the sacrificial material layer prior to forming the gate stack. A gate stack is formed above the sacrificial material layer, and source/drain regions may be formed either embedded within the silicon layer or raised on the silicon layer. Subsequently, the sacrificial material layer is removed, forming a tunnel, and a stress liner is formed in the remaining portion of the tunnel conforming to the shape of the protuberance. An additional stress liner may also be formed over the gate stack and the substrate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
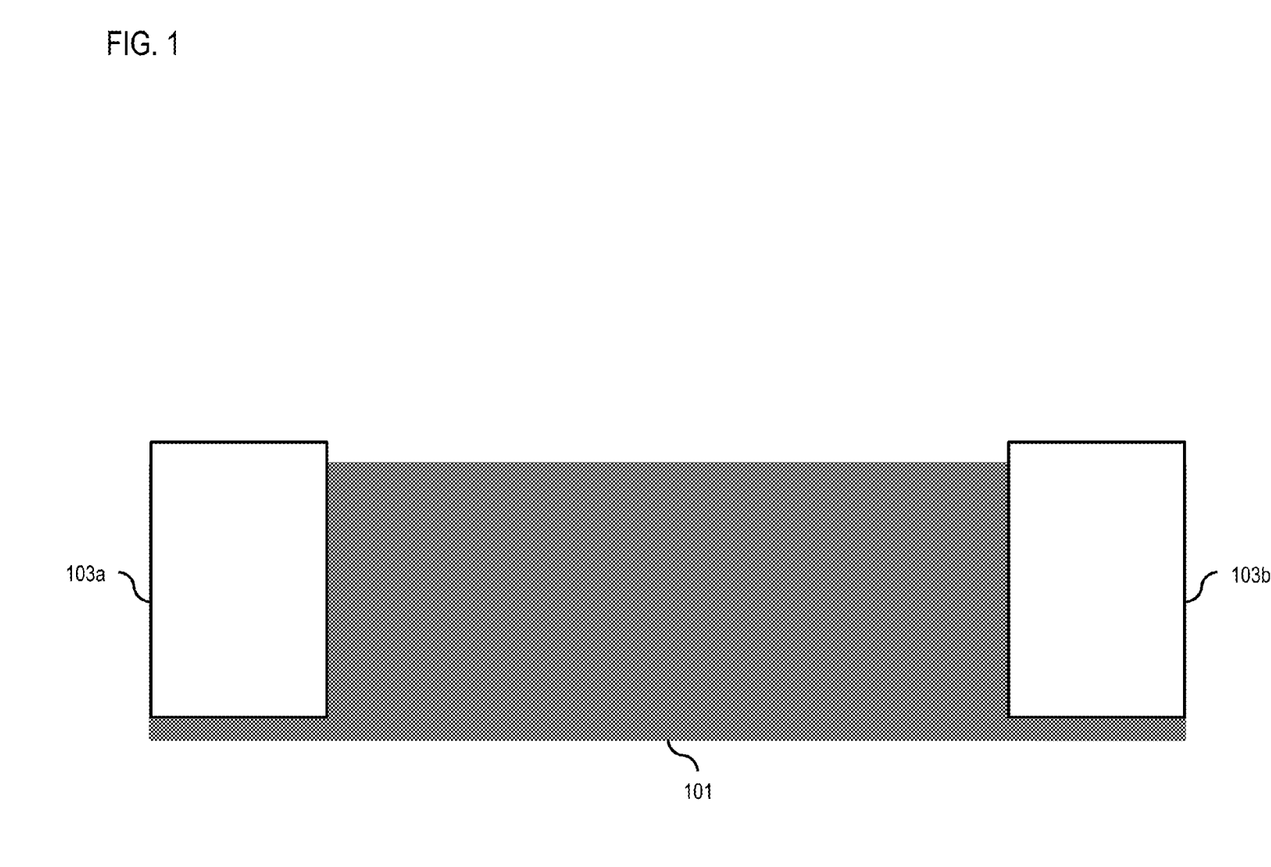
FIGS. 1 through 8 schematically illustrate a process flow for fabricating a semiconductor device having an n-shaped bottom stress liner, in accordance with an exemplary embodiment.

Adverting to FIG. 1, a method for forming a semiconductor, in accordance with an exemplary embodiment, begins with a substrate 101 and a pair of shallow isolation trench (STI) structures 103a and 103b. The substrate 101 may be made of silicon.

Figure 2:
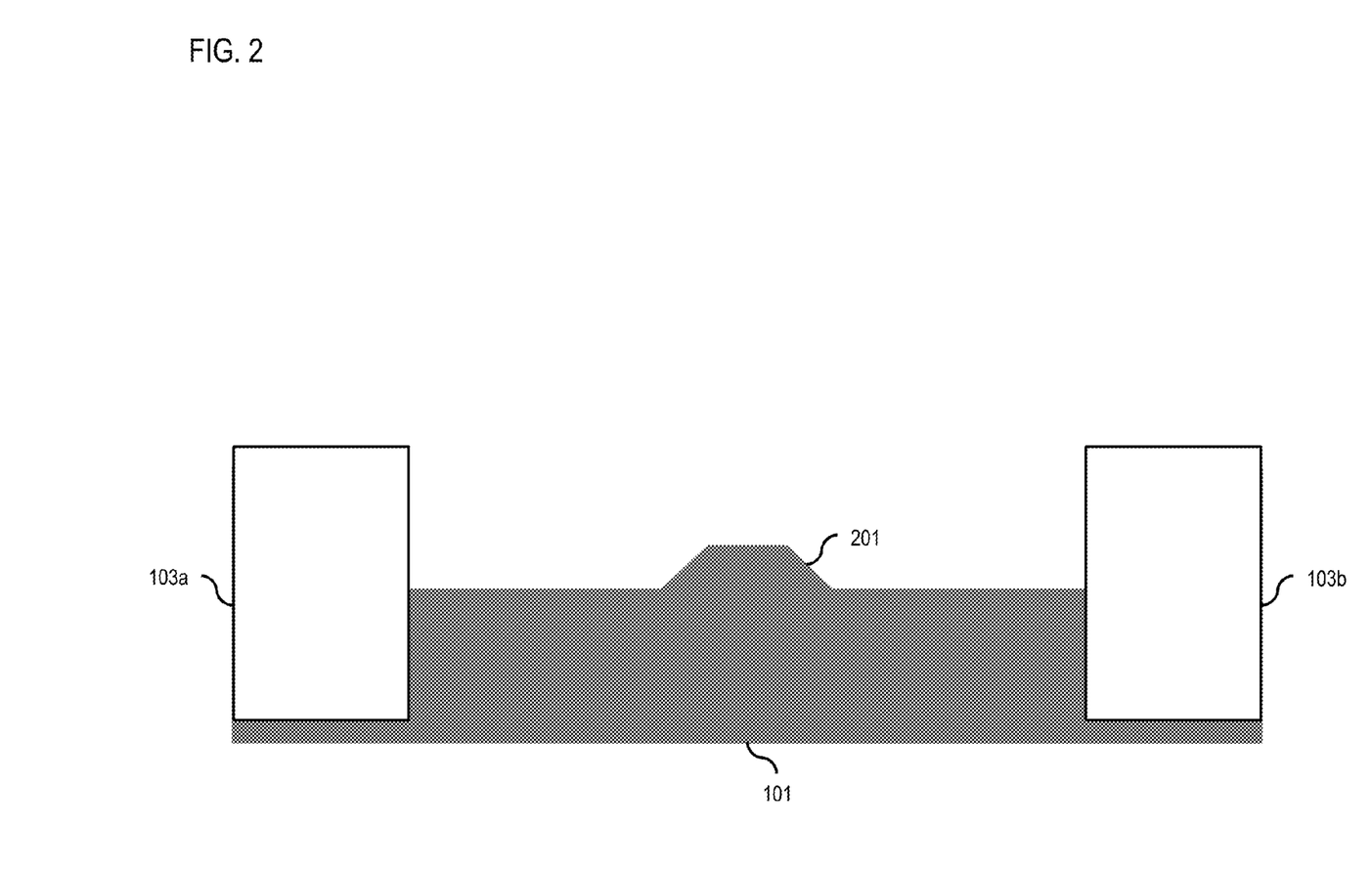

As illustrated in FIG. 2, a section of the substrate 101 is removed forming a protuberance 201. Protuberance 201 may be formed by etching the substrate. By way of example, room temperature ammonium hydroxide ($NH_4OH$) may be used to etch the substrate 101. The protuberance 201 may be formed based on a gate mask with different gate trim conditions. As illustrated in FIG. 2, the protuberance 201 has a shape similar to that of the letter n. The width of the protuberance may be varied according to the size of a gate stack, to be formed thereon, as discussed below.

Figure 3:
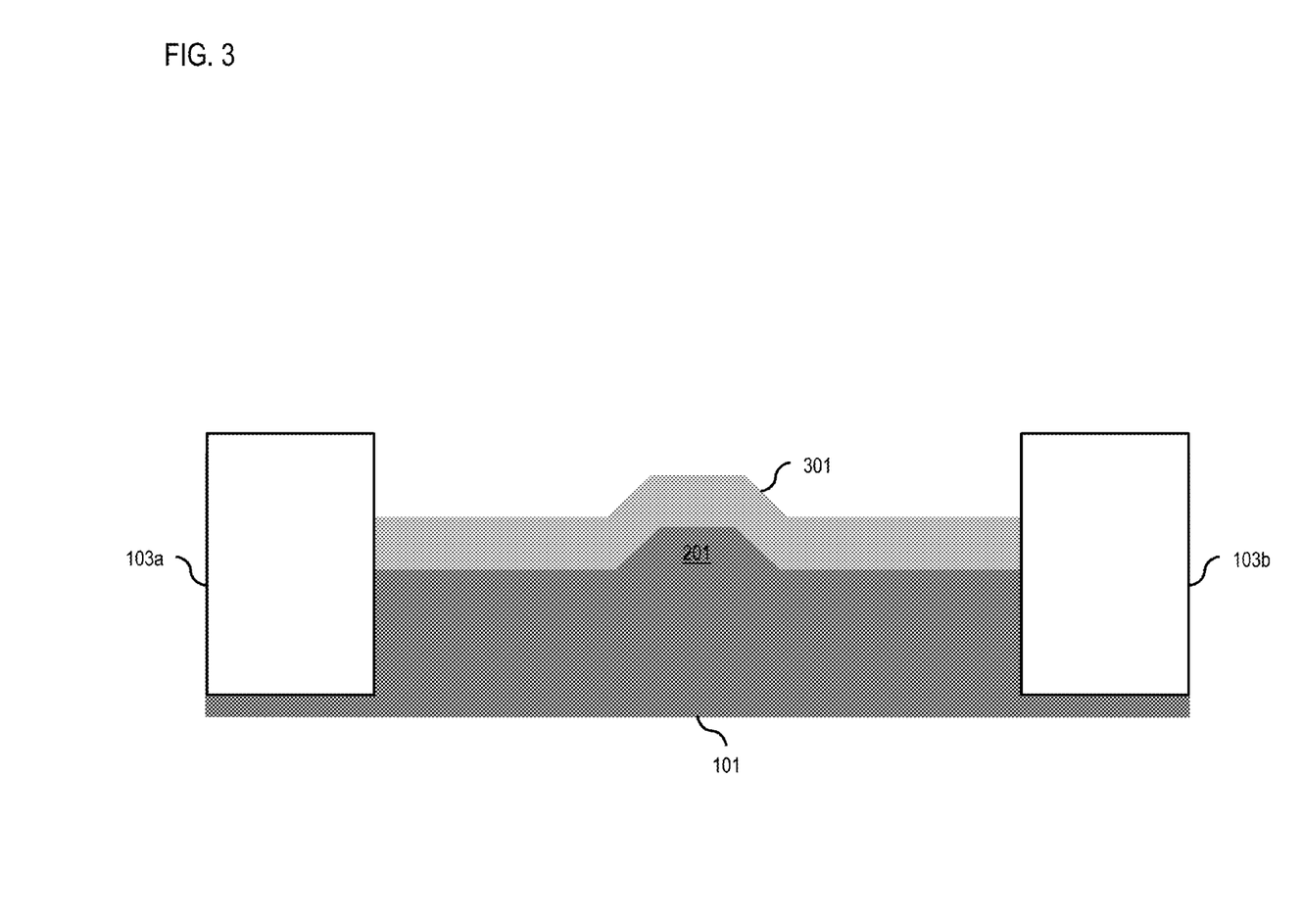

Next, a sacrificial material layer 301 is conformally formed over the substrate 101 and the protuberance 201. As illustrated in FIG. 3, the sacrificial material layer 301 conforms to the shape of the protuberance 201. The sacrificial material layer 301 may be formed of SiGe and may be formed to a thickness of 10 nm to 30 nm, for example 20 nm. The sacrificial material layer 301 may be formed by epitaxial growth.

Figure 4:
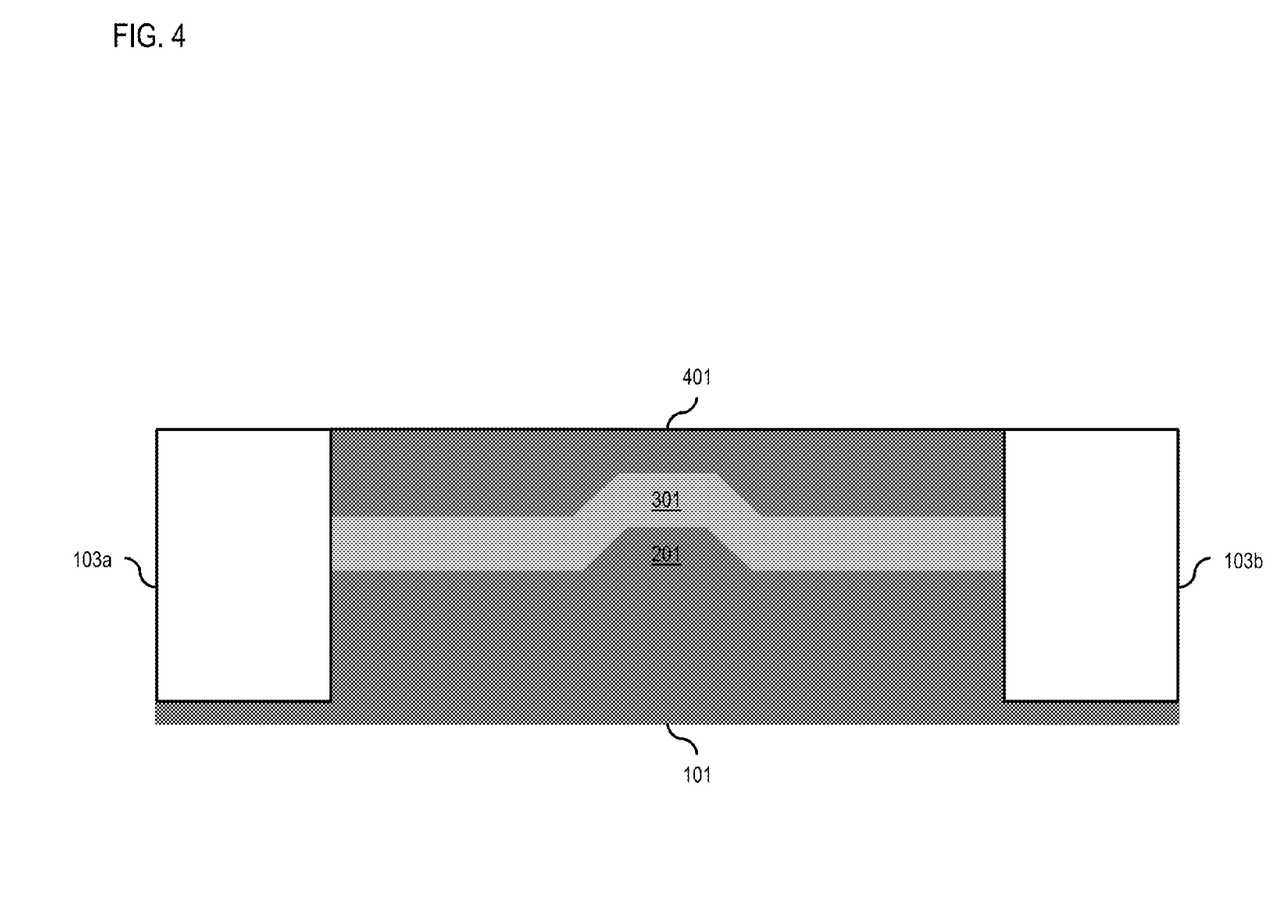

Adverting to FIG. 4, a silicon layer 401 is formed over the sacrificial material layer 301 forming a channel. The surface of the silicon layer 401 nearest the sacrificial material layer 301 conforms to the shape of the protuberance 201. The opposite surface of the silicon layer 401 may be level and coplanar with the tops of the pair of STI structures 103a and 103b. The silicon layer 401 may be formed by epitaxial growth. The thickness of the silicon layer 401 above the top of protuberance 201 may range from 15 nm to 30 nm.

Figure 5:
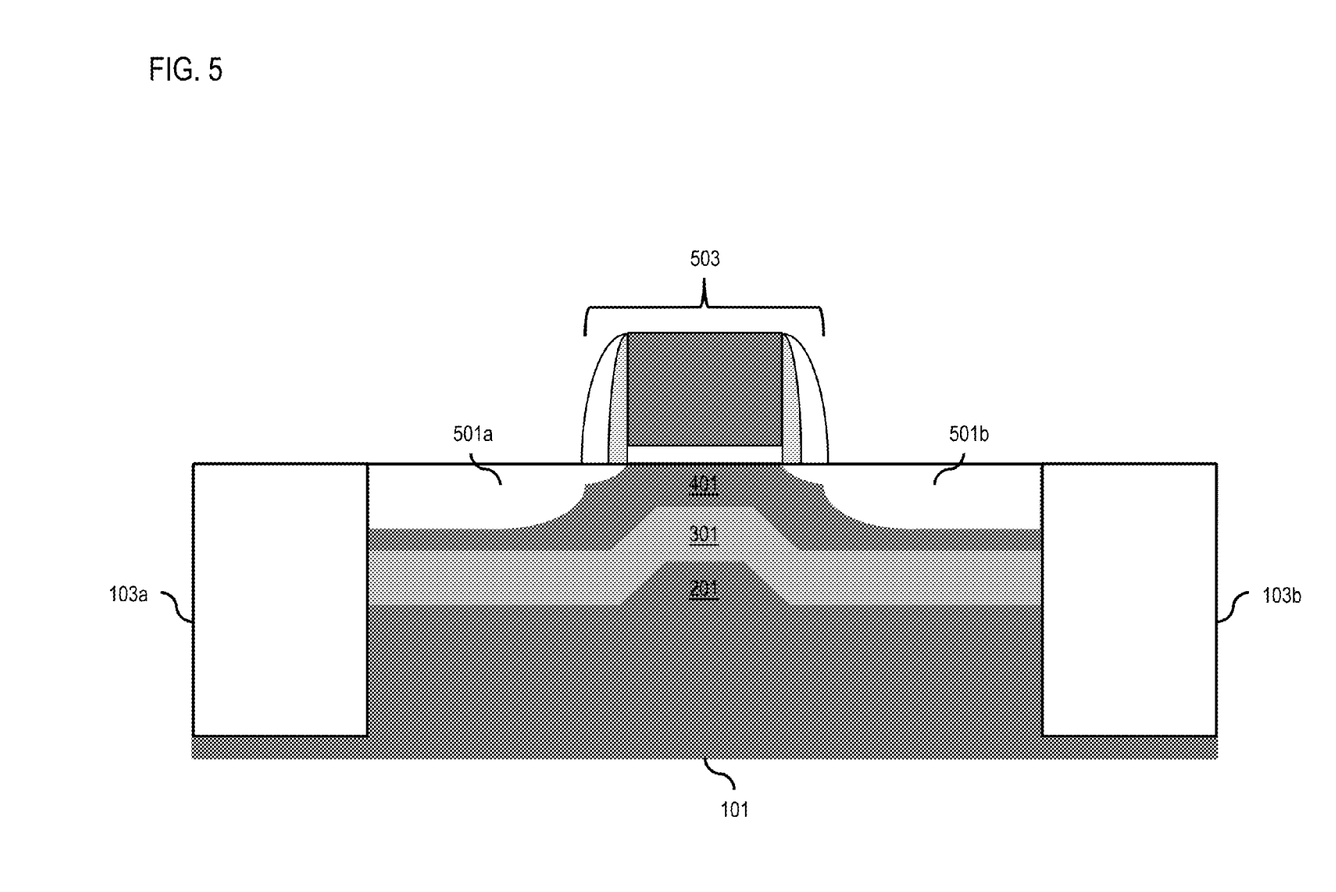

As shown in FIG. 5, sections of the silicon layer 401 may be doped to form source/drain regions 501a and 501b embedded within the silicon layer 401. Subsequently, a gate stack 503 may be formed above the silicon layer 401, between the source/drain regions 501a and 501b, according to a gate last process. Alternatively, the gate stack 503 may first be formed above the silicon layer 401. Subsequently, sections of the silicon layer 401 may be doped to form source/drain regions 501a and 501b embedded within the silicon layer 401, according to a gate first process. The width of the gate stack 503 and the width of the protuberance 201 may be varied, such that the width of the protuberance 201 is equal to the width of the gate stack 503, or the width of the protuberance 201 is wider than the width of the gate stack 503. By way of example, the protuberance 201 may be as much as about 26 nm wider than the gate stack 503. The gate stack 503 may be formed to be in alignment with the protuberance 201. By way of example, the gate to active region overlay distance may be 8 nm, the distance between the gate and the critical dimension uncertainty (CDU) may be 4 nm, the distance between the gate and the active region root sum square (RSS) may be 8 nm, and the distance between the gate to liner RSS may be 11 nm. In an alternative embodiment, instead of forming source/drain regions 501a and 501b, raised source/drain regions (not shown for illustrative convenience) may be formed above silicon layer 401 on each side of gate stack 503, subsequent to formation of the gate stack. For all embodiments, the source/drain regions and the gate stack 503 may be formed according to conventional manufacturing processes.

Figure 6:
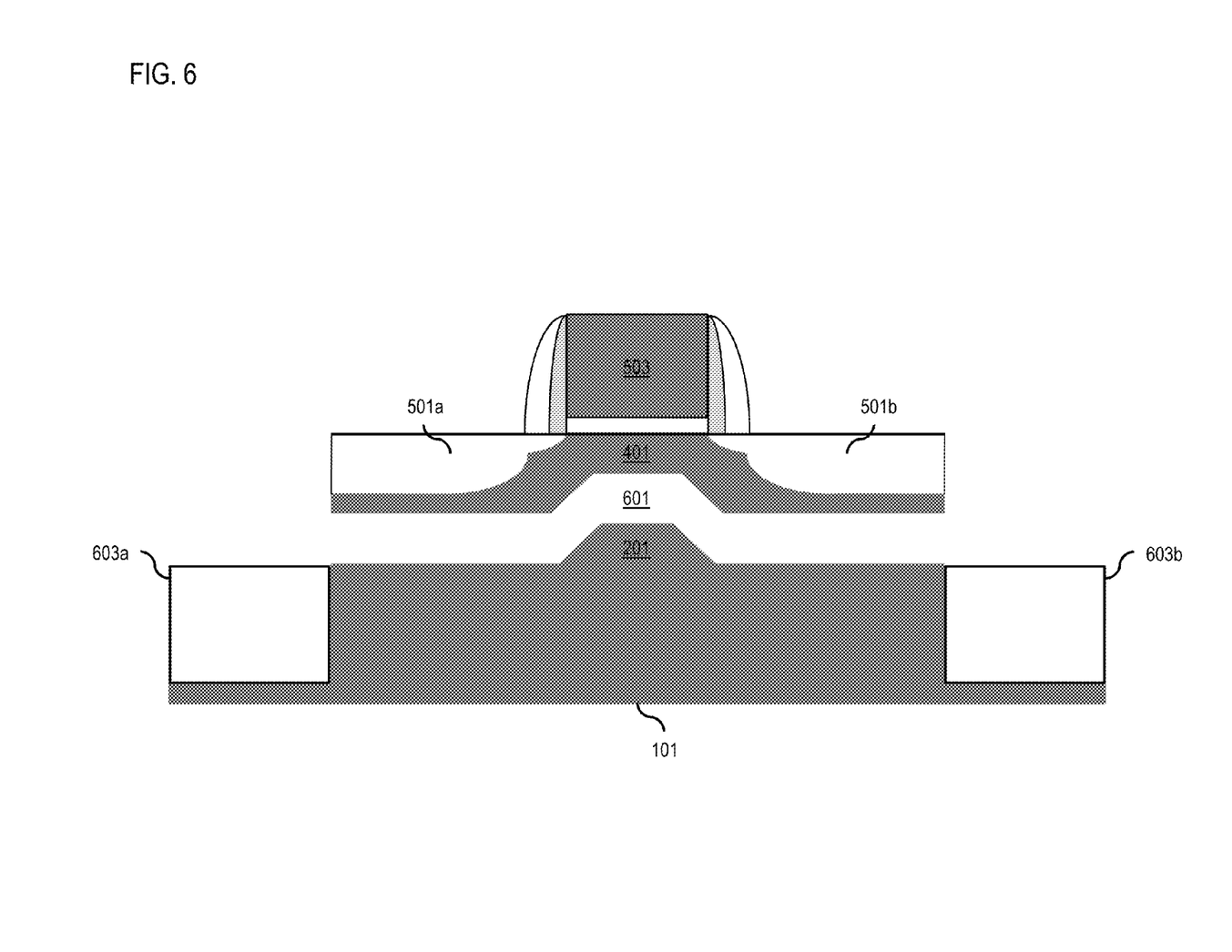

As illustrated in FIG. 6, the pair of STI structures 103a and 103b are recessed so that the top surface of STI structures 103a and 103b is coplanar with the level surface of the substrate 101, thereby forming recessed STI structures 603a and 603b. Next, the sacrificial material layer 301 is removed to form a tunnel 601. The sacrificial material layer 301 may removed according to a self-aligned process from the active edges of the sacrificial material layer 301 exposed after forming the recessed STI structures 603a and 603b. The silicon layer 401, the source/drain regions 501a and 501b, and the gate stack 503 remain supported by gates overlapping the STI structures (not shown for illustrative convenience).

Figure 7:
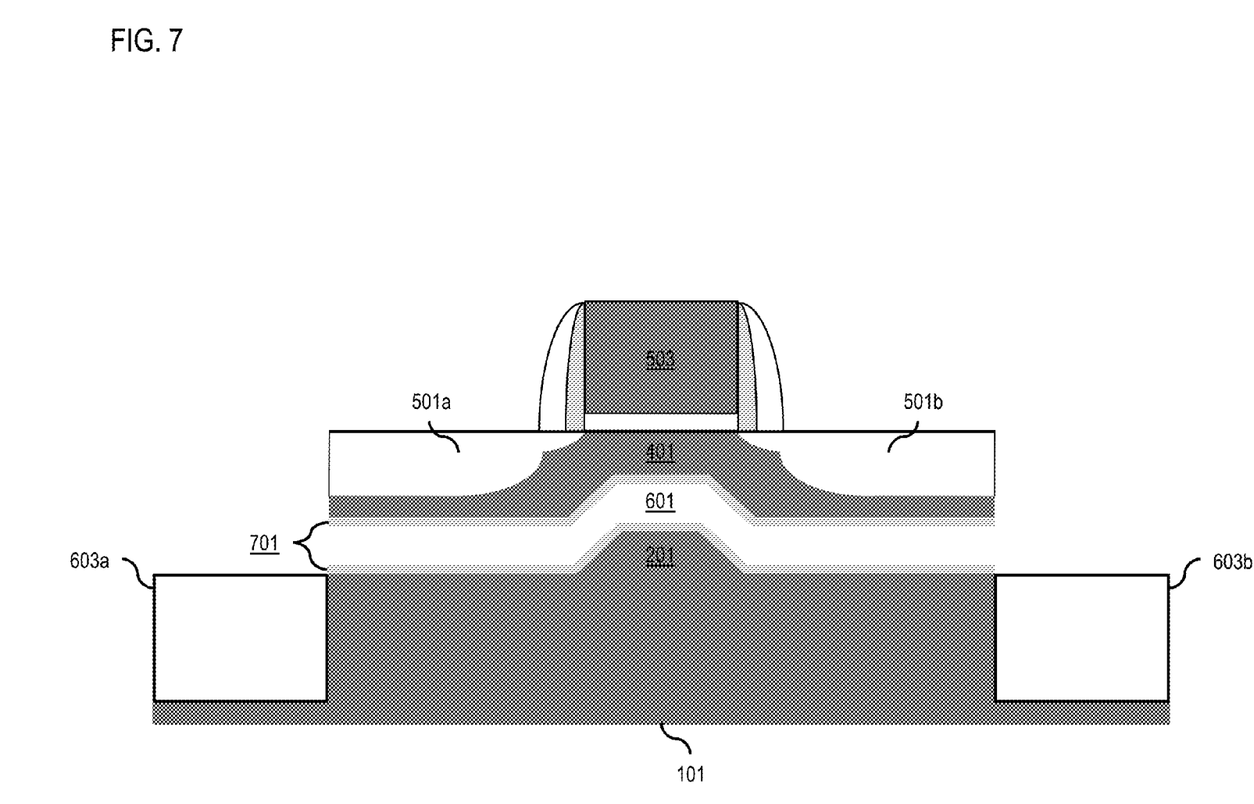

As shown in FIG. 7, the tunnel 601 is then conformally lined with a passivation layer 701. The passivation layer 701 may be formed of any type of thermal oxide, such as silicon dioxide ($SiO_2$), and may be formed to a thickness of 1 nm to 2 nm, for example 2 nm. In an alternative embodiment, the passivation layer 701 is optional.

Figure 8:
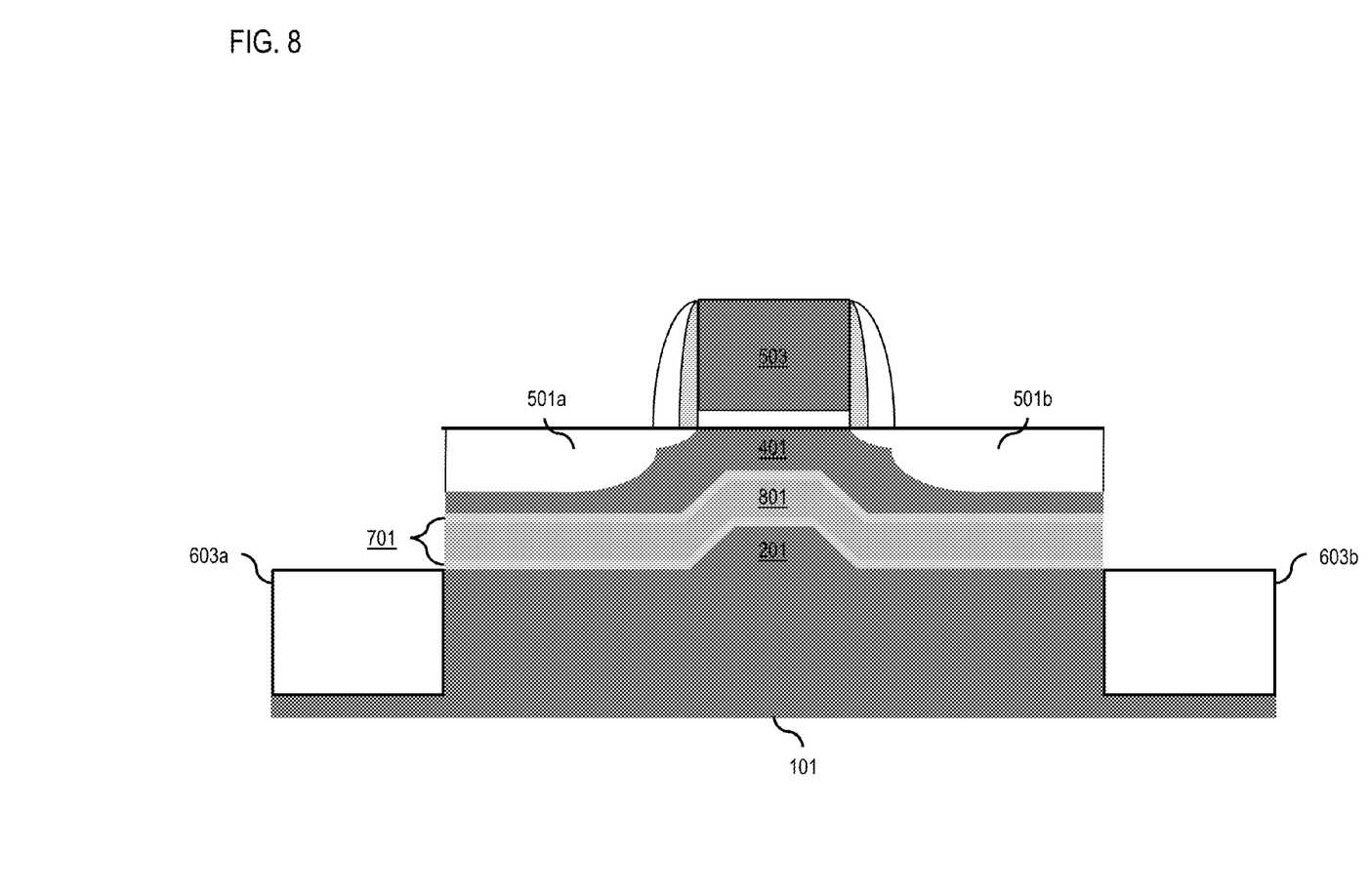

Adverting to FIG. 8, a stress liner 801 is formed to fill the tunnel 601 and conform to the shape of the protuberance 201. The stress liner 801 may be formed of any stress liner material, such as silicon nitride ($Si_3N_4$), diamond-like carbon, etc. The stress liner 801 may be deposited using low-pressure chemical vapor deposition (LPCVD). After deposition of the stress liner 801, the stress liner 801 may be annealed.

Figure 9:
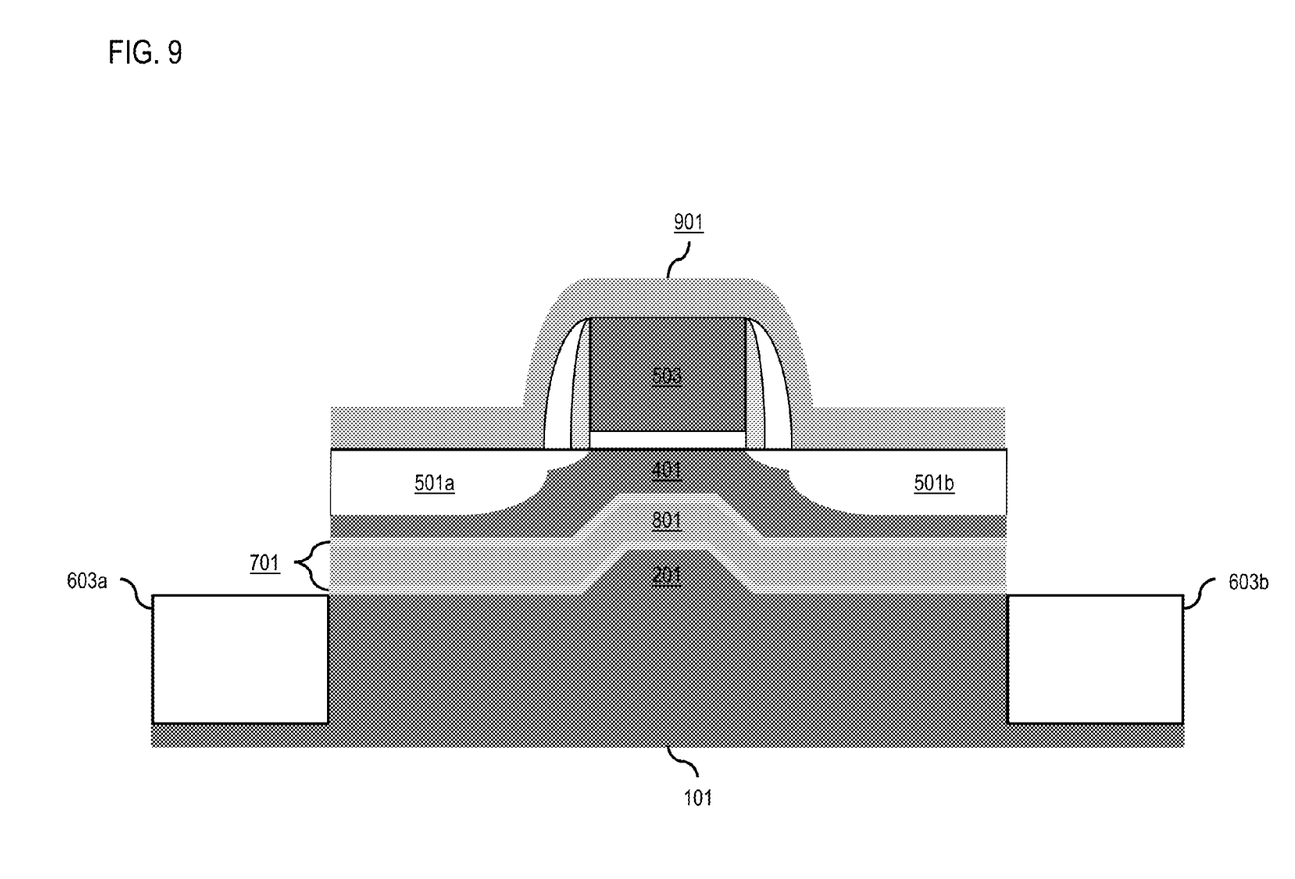
FIG. 9 schematically illustrates an optional additional step in fabricating a semiconductor device having an n-shaped bottom stress liner, in accordance with another exemplary embodiment.

In an alternative embodiment, as illustrated in FIG. 9, an additional stress liner 901 may be conformally formed over the source/drain regions 501a and 501b and the gate stack 503. The additional stress liner 901 may be formed of the same or different material as the stress liner 801.

The embodiments of the present disclosure achieve several technical effects, including the ability to effectively apply stress in high density semiconductor devices. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
a substrate having a protuberance;
a stress liner above and conforming to a shape of the protuberance; and
a gate stack above the stress liner.

2. The device according to claim 1, further comprising:
a silicon layer above the stress liner, a surface of the silicon layer nearest the stress liner conforming to the shape of the protuberance.

3. The device according to claim 2, wherein the gate stack is above the silicon layer.

4. The device according to claim 2, further comprising:
source/drain regions above the silicon layer.

5. The device according to claim 2, further comprising:
source/drain regions in the silicon layer.

6. The device according to claim 2, further comprising:
a passivation layer between the stress liner and the silicon layer conforming to the shape of the protuberance.

7. The device according to claim 6, comprising:
a thickness of the passivation layer being 1 to 2 nm.

8. The device according to claim 1, further comprising:
a passivation layer between the stress liner and the substrate conforming to the shape of the protuberance.

9. The device according to claim 8, comprising:
a thickness of the passivation layer being 1 to 2 nm.

10. The device according to claim 1, further comprising:
a pair of shallow trench isolation (STI) structures,
wherein the protuberance is between the pair of STI structures.

11. The device according to claim 1, wherein a thickness of the stress liner is 10 to 30 nm.

12. The device according to claim 11, wherein the thickness of the stress liner is approximately 20 nm.

13. The device according to claim 1, further comprising:
an additional stress liner above the gate stack.

14. The device according to claim 1, wherein a base of the protuberance is wider than the top of the protuberance.

15. The device according to claim 1, wherein a width of the protuberance is equal to a width of the gate stack.

16. The device according to claim 1, wherein a width of the protuberance is greater than a width of the gate stack.

17. The device according to claim 1, wherein a center of the gate stack and a center of the protuberance are aligned.

18. A device comprising:
a substrate having a protuberance;
a stress liner above and conforming to a shape of the protuberance; and
a gate stack above the stress liner,
wherein a center of the gate stack and a center of the protuberance are aligned, and a width of a bottom of the protuberance is greater than a width of a top of the protuberance.

19. A device comprising:
a substrate;
a pair of shallow trench isolation structures (STI) formed within or above the substrate;
a protuberance formed on a surface of the substrate and between the STI structures;
a stress liner above and conforming to the shape of the protuberance;
a silicon layer above the stress liner, a surface of the silicon layer nearest the stress liner conforming to the shape of the protuberance; and
a gate stack above the stress liner and aligned with the protuberance.

20. The device according to claim 19, further comprising:
a first passivation layer between the stress liner and the substrate conforming to the shape of the protuberance formed to a thickness of 1 to 20 nm; and
a second passivation layer between the stress liner and the silicon layer conforming to the shape of the protuberance formed to a thickness of 1 to 20 nm,
wherein a base of the protuberance is wider than a top of the protuberance.

* * * * *